United States Patent [19]

Karas

[11] 4,091,068
[45] May 23, 1978

[54] METHOD OF IMMOBILIZING A PRINTED CIRCUIT BOARD

[75] Inventor: Joseph Walter Karas, Phoenix, Ariz.

[73] Assignee: Motorola Inc., Schaumburg, Ill.

[21] Appl. No.: 685,848

[22] Filed: May 13, 1976

[51] Int. Cl.² ........................... B29B 1/14; B29B 3/02
[52] U.S. Cl. .................................. 264/274; 264/275; 264/279
[58] Field of Search ............... 264/274, 275, 278, 279, 264/220, 226, 227

[56] References Cited

U.S. PATENT DOCUMENTS

| | | | |
|---|---|---|---|
| 3,238,281 | 3/1966 | Kato | 264/275 |
| 3,408,436 | 10/1968 | Cubitt | 264/274 |
| 3,642,560 | 2/1972 | Marsh | 264/274 |

Primary Examiner—Donald J. Arnold
Attorney, Agent, or Firm—Eugene A. Parsons

[57] ABSTRACT

A hardenable material such as epoxy is placed between a circuit board edge portion and a recessed channel of a keeper member mounted on a base. The epoxy fills the space between the channel walls and the board edge portion and immobilizes the board relative to the base once it hardens. This eliminates the movement of the circuit board relative to the base. Release agent may be coated on the edge of the circuit board and the recessed channel walls of the support base so that when required, the printed circuit board can be readily and non-destructively removed from the base.

3 Claims, 2 Drawing Figures

METHOD OF IMMOBILIZING A PRINTED CIRCUIT BOARD

BACKGROUND OF THE INVENTION

This invention relates to a method of and an apparatus for immobilizing a printed circuit board when the board is connected to a support base through a connector.

Various connectors of diverse designs are utilized to immobilize the printed circuit board once mounted on a support base. A typical example is a locking screw used to secure the printed circuit board to the support base. Such a solution is time consuming and requires many separate parts to effect the fastening.

It is the object of the present invention to provide an improved method of and an apparatus for immobilizing a printed circuit board when the board is connected to a support base.

The foregoing and other objects in accordance with the present invention, are implemented advantageously using a channeled member, called a keeper, and a board provided with a notch at an edge thereof and a keeper with a channel with a recess of a wider cross-section intermediate thereof to receive an edge portion of the board. A moldable and hardenable material, such as an epoxy, is placed in the recess and adjoining portions of the channel. Then the printed circuit board is inserted into the channel so that the edge portion of this board with the notch is positioned in the recess. The printed circuit board is then pressed against the support base whereby the moldable and hardenable material is pressed and shaped to form-fit and fill the gap between the notch of the circuit board and the walls of the channel of the keeper. The moldable material hardens and the hardened material immobilizes the pluggable printed circuit board relative to the support base. The notch and adjoining areas of the notch of the circuit board and the channel are coated with a release agent, as an optional feature.

The foregoing and other aspects of the present invention will be more clearly apprehended from the following detailed description of an illustrative embodiment of the present invention in conjunction with the accompanying drawings.

DETAILED DESCRIPTION

Figure 1:
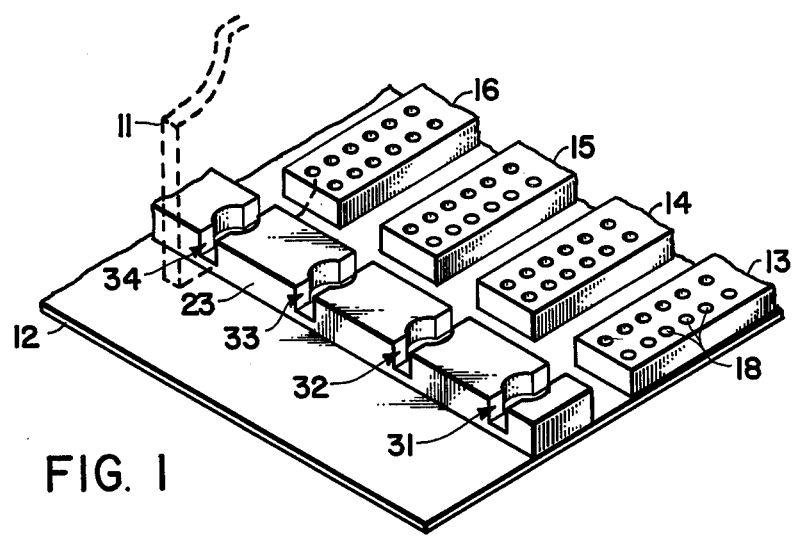
FIG. 1 shows a perspective of an assembly including a support base, a plurality of connectors and a comb-like keeper used as the member for immobilizing the circuit board once the circuit is mounted on the base support.

FIG. 1 illustrates an assembly which includes a plurality of pluggable circuit boards 11 illustrated in phantom which can be inserted on the support base 12 through a plurality of elongated connectors 13, 14, 15 and 16 which may be positioned securely on the support base 12 in parallel, as illustrated. Typically, the circuit board 11 shown in phantom has a plurality of pins which are designed for insertion into the receiving sockets 18 on the connectors. In this manner a plurality of printed circuit boards may be mounted on the support base 12 in a compact form.

As illustrated, there is shown an elongated comb-like keeper member 23. The comb-like keeper may be in the form of an elongated block and is positioned transverse to the connecters at each end thereof, as illustrated in FIG. 1. The comb-like member may be an integral part of the support base itself or a separate member solidly bonded or secured to the base support. The comb-like keeper member is designed so that when circuit board is mounted onto the support base, it immobilizes the circuit board relative to the support base 12.

In accordance with an aspect of the present invention the comb-like member, or the keeper, is channeled in a plurality of locations 31, 32, 33, 34 and so on, which are positioned transverse to the length of the keeper and aligned with the connectors 13, 14, 15, 16 and so on to receive the printed wiring board edges. This can be more clearly understood with reference to FIG. 2 which shows in detail how a channel of the keeper is used to immobilize the printed circuit board. As illustrated therein the printed circuit board 11 mounted on the connector has a portion 35 extending further out so that an edge portion 36 thereof can be inserted into the channel.

Figure 2:
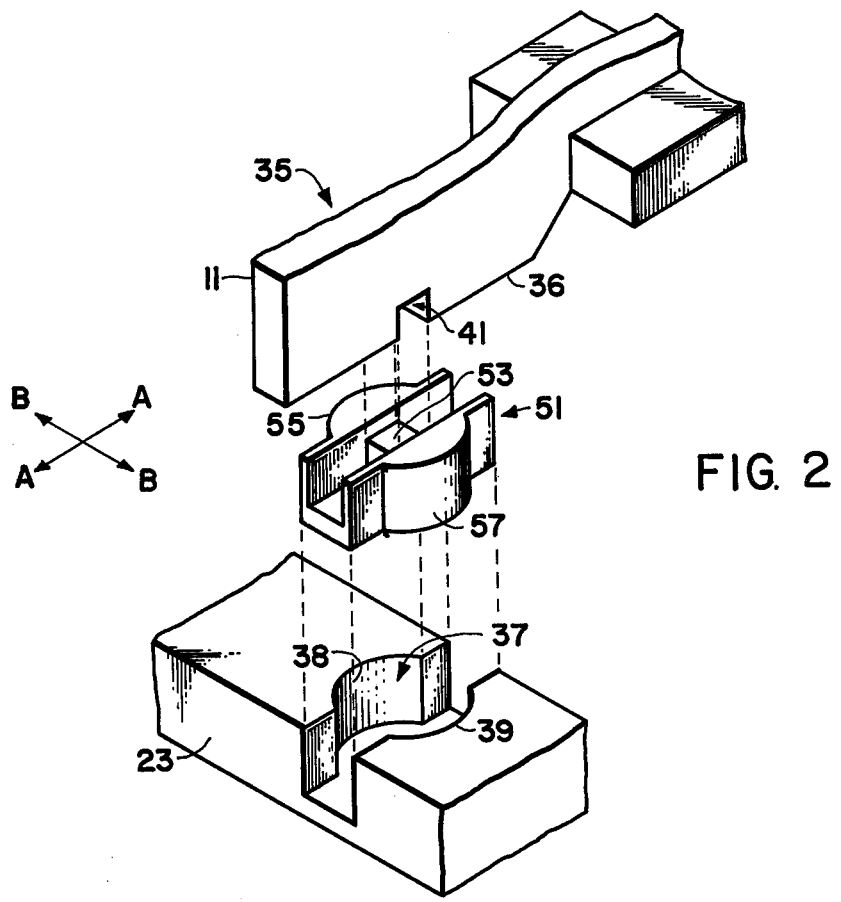
FIG. 2 shows an exploded perspective view of the printed circuit board, the comb-like structure secured and an epoxy pellet cast in place between the circuit board and keeper.

As illustrated in FIG. 2, preferably the keeper 23 has a plurality of channels, each of which has a recessed portion 37 intermediate thereof. As illustrated in FIG. 2, the recessed portion is formed by a pair of relatively concave walls 38 and 39 along the opposite sides of the channel. This provides a cross-sectional area which is somewhat wider than the two end portions of the channel. Preferably the edge portion 36 of the printed wiring board has a notch 41 positioned so that when the printed wiring board is inserted into the keeper, the notch positions itself substantially in the center of the recessed channel.

In accordance with another aspect of the present invention, the circuit board edge can be intersected into the channel and pulled out non-destructively, i.e., pulled out without injuring the board or the support base or the keeper. This can be done by coating the channel surfaces, that is, the bottom surface and the side wall surfaces and the notch 41 and the adjoining areas of the notch at the printed wiring board 35 with a release agent. The release agent is used to permit ready release of the printed circuit board from the support base when and if it is desired. The use of release agent prevents the destructive dismounting of the printed circuit board that would take place otherwise. For the release agent, one may use any suitable material available in the market place such as, Slide, a carnauba wax base, made by Percy Harms Corp. of Skokie, Illinois; MS-122, a dry film of a fluorcarbon base, made by the Miller-Stevenson Co. of Los Angeles, California; TC-521, a silicone base, made by Tech-Form Labs of Los Angeles, California; Polylease, of a polypropylene base, made by Allied Chemical Corp. of Morristown, New Jersey; and Release Gen H-151-1 of a lecithin base, made by General Mills of Minneapolis, Minnesota.

Still another aspect of the invention entails use of a moldable and hardenable material in conjunction with the keeper 23 in immobilizing the circuit board once it is mounted on the support base. For the moldable and hardenable material, advantageously suitable epoxy may be used since they mold and harden once they are exposed to air. The epoxy material for the epoxy pellet may be chosen from a number of products available on the market such as, Ablebond 224-1, containing an aromatic amine curing agent, made by Ablestick Co., of Gardena, California; EC1838, a modified epoxy containing a polyamide curing agent, made by 3M Corp. of Minneapolis, Minnesota; and Hysol EA907, containing a polyamide curing agent, made by Hysol Div. of Dexter Corp, City of Industry, California.

The present invention may be practiced as follows. First, the channels of the keeper and the edge portion 36 of the circuit board is coated with any one of the aforementioned release agents, as an optional step if the board has to be removed later on. Then, the channel 31 is filled with a suitable hardenable and moldable material such as an epoxy of the types mentioned above. After filling the material in the channel, the edge of portion 36 of the circuit board 11 is inserted into the channel 31. As the board is pressed against the support base, the hardenable and moldable material spreads out and fills the space between the walls of the channels and the notched edges and is formed as illustrated in FIG. 2. Note that there is formed a ridge 53 due to mate with the notch 41. Once hardened the hardenable and moldable material 51 becomes solid and rigid. Consequently, the ridge form-fits and mates with the notch 41. The pellet also has convex or protruding portions 55 and 57 formed to formfit the space between the board and the recessed channel walls 38 and 39. Consequently, the ridge 53 and the protruding portions 55 and 57 serve as a key to lock and prevent the movement of the board in the direction of the plane of the board or transverse thereto, respectively as shown by the arrows A—A and B—B shown in FIG. 2.

In this manner, the pellet 51, in effect, immobilizes the board 11 relative to the support base 12 once it is plugged in and the epoxy hardens.

In summary then, in accordance with the present invention, a printed circuit board can be immobilized relative to the support base, once it is plugged into the support base as follows. The circuit board may be provided with a notch or may have a notch already at an edge thereof. The keeper may be provided with a plurality of channels each having a recess of a wider cross section intermediate the channel. The channel walls may be coated and the notch and areas adjoining the notch of the board the release agent, if nondestructive demounting of the board is desired. The moldable and hardenable material is then placed into the recess and the adjoining portion of the channel. Then, the edge portion of the board is inserted into the channel and pressed against the supporting base while the pins of the board are plugged into the connector. The moldable and hardenable material is pressed to formfit and fill the gap between the circuit board and the channel walls and bottom. In time, the moldable material hardens and when it hardens, it removably secures the circuit board to the support base and immobilizes so that it is not free to move relative to the support base.

While the present invention is illustrated in terms of a method of and an apparatus for securing a printed circuit board to a support, various modifications and use will be evident to any person of ordinary skill in the art without departing from the scope and the spirit of the present invention.

What is claimed is:

1. A method of immobilizing a pluggable board when the board is plugged into a connector and a keeper mounted on a supporting base, said method comprising the steps of:
   providing a channel in the keeper for receiving an edge of the pluggable board, the channel having a recess with a wider cross-section intermediate the channel;
   providing a notch in the edge of the pluggable board situated so as to be generally within the channel in the keeper with the pluggable board properly inserted in the connector and keeper;
   placing a soft moldable and hardenable material into the channel of the keeper;
   inserting an edge portion of the board with the notch into the channel;
   pressing the board against the keeper so that the moldable and hardenable material is squeezed out and pressed to form fit and fill the gap between the notch of the circuit board and the support; and
   hardening said moldable material so that when it hardens it prevents any movement of the board relative to the supporting base.

2. The method according to claim 1, for the moldable and hardenable material an epoxy is used.

3. The method according to claim 2 including the step of coating the channel walls and the notch and the areas adjoining the notch before the epoxy is placed in the channel to permit nondestructive dismounting of the board.

* * * * *